United States Patent [19]

Bradford

[11] Patent Number: 4,798,290

[45] Date of Patent: Jan. 17, 1989

[54] ELECTROSTATIC DISCHARGE CARTON

[75] Inventor: Judson A. Bradford, Holland, Mich.

[73] Assignee: Bradford Company, Holland, Mich.

[21] Appl. No.: 130,900

[22] Filed: Dec. 10, 1987

[51] Int. Cl.[4] .................. B65D 73/02; B65D 85/42
[52] U.S. Cl. .............................. 206/328; 206/591;
229/23 A; 493/94; 493/100
[58] Field of Search .......... 229/23 A; 206/328, 524.6,
206/591; 361/212, 220; 493/89, 94, 100, 379,
390, 904

[56] References Cited

U.S. PATENT DOCUMENTS

| | | | |
|---|---|---|---|
| 4,160,503 | 7/1979 | Ohlbach | 206/328 |
| 4,211,324 | 7/1980 | Ohlbach | 206/328 |
| 4,293,070 | 10/1981 | Ohlbach | 206/328 |
| 4,427,114 | 1/1984 | Howell, et al. | 206/328 |
| 4,480,747 | 11/1984 | Kazor et al. | 206/328 |
| 4,482,048 | 11/1984 | Blodgett | 206/328 |
| 4,528,222 | 7/1985 | Rzepecki et al. | 206/328 |
| 4,609,104 | 9/1986 | Kasper et al. | 206/328 |
| 4,610,353 | 9/1986 | Young | 206/328 |
| 4,684,020 | 8/1987 | Ohlbach | 206/328 |
| 4,685,563 | 8/1987 | Cohen et al. | 206/328 |
| 4,707,414 | 11/1987 | Long et al. | 206/328 |
| 4,711,702 | 12/1987 | Hood | 206/328 |

OTHER PUBLICATIONS

Distribution Packaging, pp. 90–92, (1977), published by Friedman and Kipnees.
"ESD Control"—brochure of Bradford Company, (2 pages), (date unknown).

Primary Examiner—Stephen Marcus
Assistant Examiner—Gary E. Elkins
Attorney, Agent, or Firm—Wood, Herron & Evans

[57] ABSTRACT

A six-walled container for protecting electronic goods contained therein from damage due to electrostatic discharge, which container has four side walls and a pair of top and bottom closure walls formed by flaps of said side walls and an electrostatic discharge pad having a central portion on one side of one of said closure walls and a pair of end portions extending between the flaps of that one closure wall to the opposite side of that same closure wall.

30 Claims, 3 Drawing Sheets

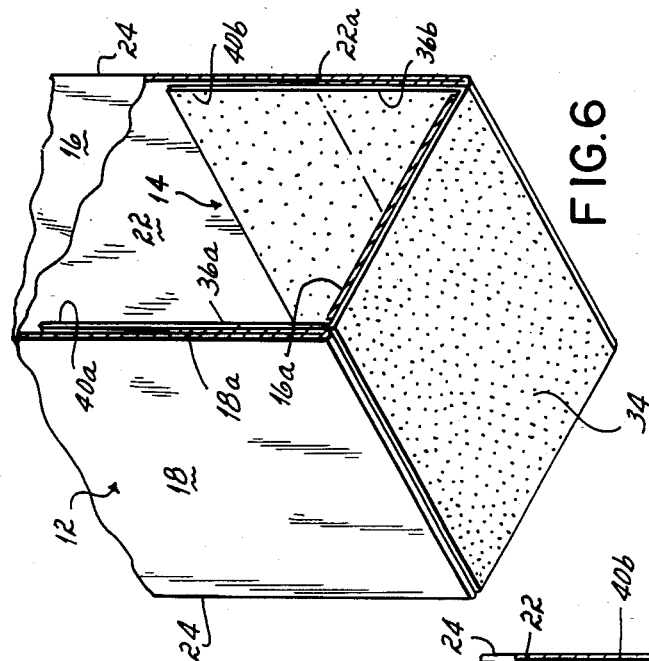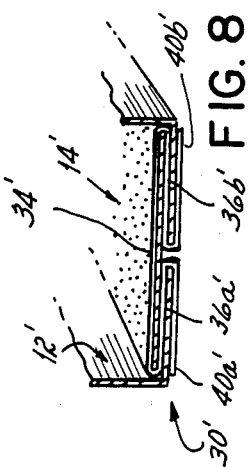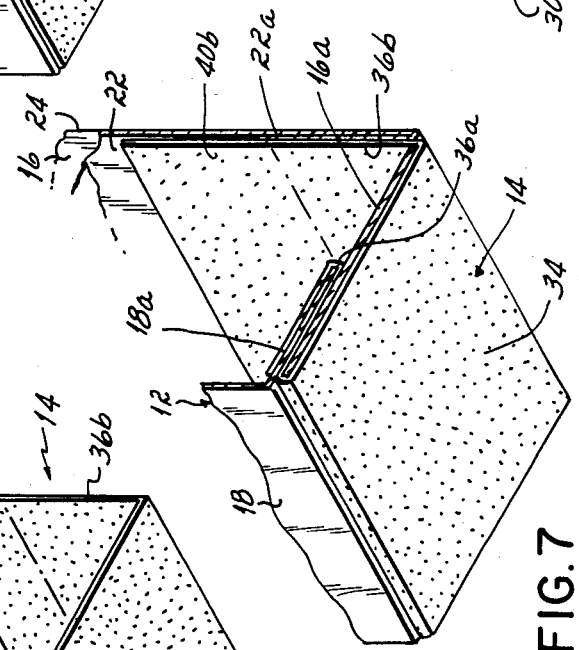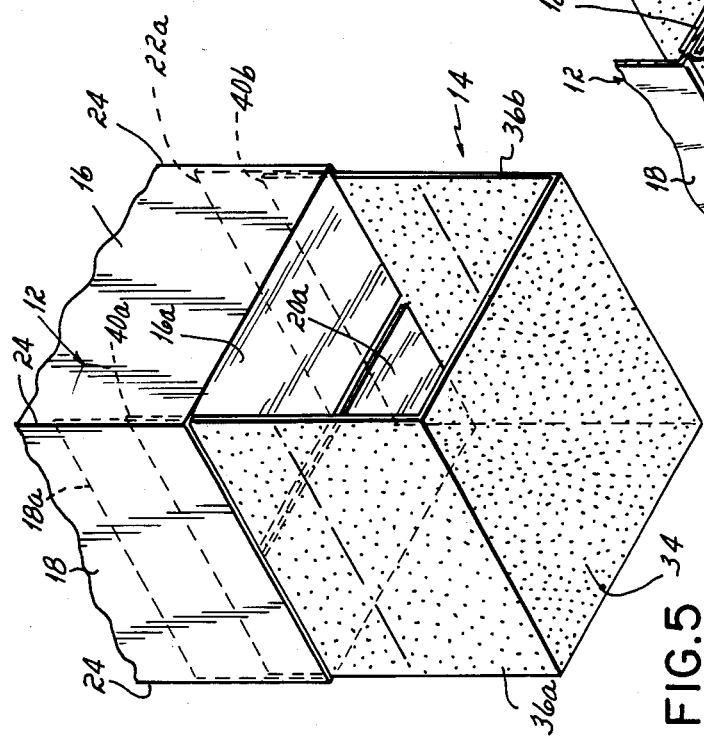

ELECTROSTATIC DISCHARGE CARTON

This invention relates to shipping containers, and more particularly to a six-sided cardboard container for shipping and storing charge-sensitive electronic devices and semi-conductor components requiring static charge protection.

It is now common to ship charge-sensitive electronic devices and semi-conductor components within containers within which a static electric charge cannot build up during shipping, handling and storage. To that end, several practices have been initiated to protect such devices. One common practice is to ship such charge-sensitive devices within a container containing electrically conductive foam within which the terminals of the devices are inserted. The conductive foam maintains all of the terminals of the device at the same electrical potential and prevents the buildup of an electrical charge thereon.

Another common practice is to make the container from an electrically conductive material. And yet another alternative is to coat the interior surface or the exterior surface, or both, of the container within which said devices are shipped and stored with a coating of electrically conductive material, as for example, a carbon-loaded ink.

While such conductive containers or conductively coated containers have proven to be effective in suppressing static electric charge and preventing damage to the static charge-sensitive contents of the container, they suffer from a number of problems of great practical significance. For example, those containers which are coated only on the inside provide electrical contact to the devices themselves, but allow static electricity to build up on the outside of the container. Those which are coated on the outside only provide a conductive surface which is readily grounded, but which may allow static electricity to build up on the inside of the container. Additionally, the presence of a dark, conductive coating on the outside of the container interferes with marking and labeling. Those containers which are coated on both the inside and the outside are expensive to produce because they require such a large quantity of conductive ink and application costs to effect the coverage. Furthermore, they require some form of electrical connector such as a conductive clip or "pigtail," between the inside surface and the outside surface. That connector may become lost or broken. And, those containers which are manufactured from electrically conductive material, as for example, carbon-loaded or impregnated material, are very expensive to manufacture because of the costs of the material.

Accordingly, it has been an objective of this invention to provide an improved carton or container for shipping and storing static-sensitive electrical components.

Another objective of the present invention has been to provide an improved container for electrostatic charge-sensitive electrical components which is less expensive to manufacture and which provides better protection to the contents of the container than prior art containers which are coated on only the interior or the exterior of the container.

It has been yet another objective of the present invention to provide an improved container for shipping and storing electrostatic charge-sensitive electrical components in which the outside surface of the bottom of the container is conductive and is electrically connected to the interior of the container so that the container shield as a whole may be readily brought to ground potential.

These objectives are achieved by the invention of this application which comprises a six-walled container having four side walls and a pair of closure walls formed by flaps of the side walls, which side walls and flaps are joined together collectively to present a six-walled container defining a cavity on the interior of the container for the storage and shipment of electrostatic charge-sensitive electronic components or goods and an electrostatic discharge pad located on one side of one closure end wall, and preferably the bottom closure end wall, of the container and having end portions of the pad which weave between the flaps of that one end closure wall to the opposite surface of the container closure wall.

The advantage of the invention of this application is that it provides a container having one exterior surface which is grounded and is connected through the electrostatic discharge pad to the interior surface of the container. This construction of the container minimizes the cost required to electrically interconnect the interior of the container with the grounded exterior.

These and other objects of this invention will be more readily apparent from the following description of the drawings in which:

FIG. 5 is a view similar to FIG. 3, but illustrating a following step in the assembly procedure.

FIG. 6 is a perspective view similar to FIGS. 3 and 4, but illustrating a still further following step in the assembly procedure.

FIG. 7 is a perspective view similar to FIGS. 3-6 illustrating one half of a last step in the procedure of assembling the electrostatic discharge pad within the container of FIG. 1.

FIG. 8 is a perspective view, partially broken away, of a second modified container embodying the invention of this application.

Figure 1:
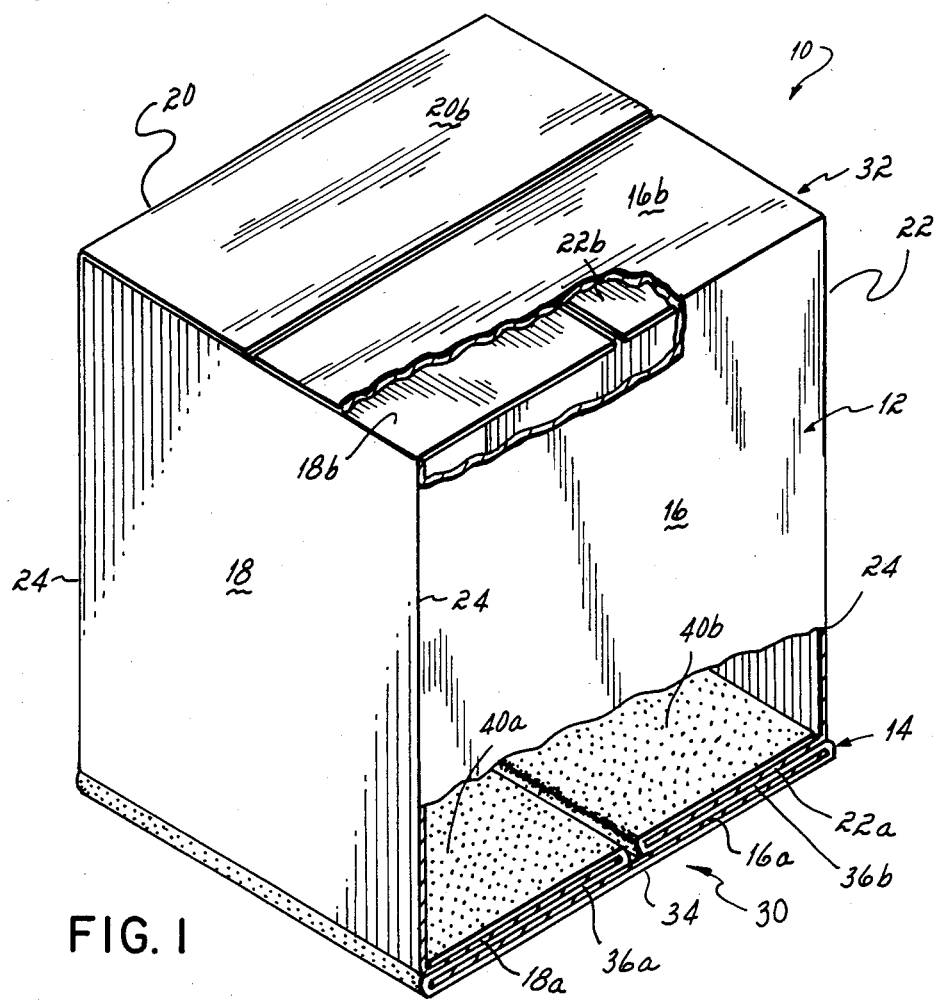
FIG. 1 is a perspective view, partially broken away, of a container incorporating the invention of this application.
Figure 2:
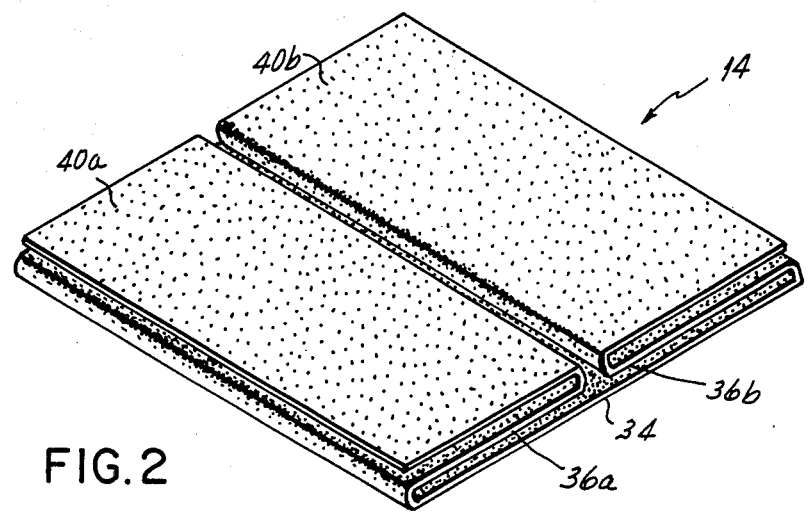
FIG. 2 is a perspective view of the electrostatic discharge pad utilized in the container of FIG. 1.
Figure 3:
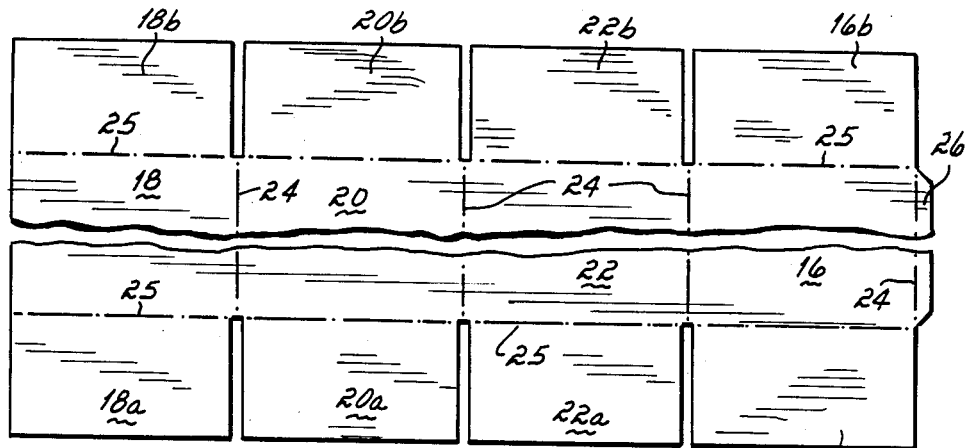
FIG. 3 is a top plan view of the blank from which the container of FIG. 1 is constructed.

With reference to FIG. 1, it will be seen that the container 10 of this invention comprises a conventional six-sided or six-walled cardboard or corrugated board carton 12 and an electrostatic discharge pad 14 (FIGS. 1 and 2). The carton 12 is manufactured from a die-cut blank 12a (FIG. 3) having four side walls 16, 18, 20 and 22. These four side walls are interconnected by score lines 24. There is preferably a flap 26 extending from the end of the side wall 16 and adapted to be adhered to the inside surface of the side wall 18 to secure the carton in an erected condition. Extending from opposite edges of each of the side walls 16, 18, 20 and 22 there are flaps 16a, 16b, 18a, 18b, 20a, 20b, and 22a, 22b. These flaps are connected to the side walls by score lines 25. These flaps, when folded in the conventional manner, form end closure walls 30, 32 on the carton as is conventional in six-sided cartons.

The invention of this application resides in the addition of the electrostatic discharge pad 14 to the carton 12 and the manner in which that pad is assembled to the carton such that the pad extends from the interior of the carton to the exterior and effectively covers that one exterior end wall. Preferably, that one exterior end wall is the bottom closure wall 30 of the carton.

To erect the carton 12, the carton blank is folded about the score lines 24 so as to create a tube, and the flap 26 is attached to the inside wall of the side wall 18. The inside or minor flaps 18a, 18b, 22a, 22b are then folded inwardly followed by the major or outside flaps 16a, 16b, 20a, 20b. The result is a six-sided carton having four side walls 16, 18, 20 and 22 and end closure walls 30, 32 at the bottom and top of the carton 12.

The electrostatic discharge pad 14 is manufactured from a volume conductive composite material, as for example, carbon loaded paperboard having a very high percentage of carbon impregnated therein. One such suitable material is manufactured by Lydall, Inc., Composite Materials Division of Manchester, Conn., and is designated as Lydall Stat-Screen® ESD material. There is sufficient carbon embedded within the material that the pad is electrically conductive. The pad could as well, though, be made of other electrically conductive materials and used in the practice of this invention so long as the pad is electrically conductive.

With reference to FIGS. 1 and 2, it will be seen that the pad 14 has a central portion 34 which completely covers the bottom closure wall 30 of the carton. The pad has end portions 36a, 36b which extend from opposite ends of the central portion 34 and interconnect the central portion 34 of the pad (which is located on the exterior of the carton) to the interior of the carton. Each end portion 36a, 36b of the pad wraps around the exterior or major flaps 16a, 20a of the carton and around the interior or minor flaps 18a, 22a of the closure wall 30. The endmost section 40a, 40b of each end portion 36a, 36b resides within the interior of the carton and lies in juxtaposition to one of the inside flaps 18a, 22a. Thereby, the pad electrically interconnects the interior of the carton 12 with the exterior surface. If the container rests atop a grounded conveyor or other grounded object, then the interior of the container will be grounded through the pad to the conveyor or object upon which the carton rests.

Figure 4:
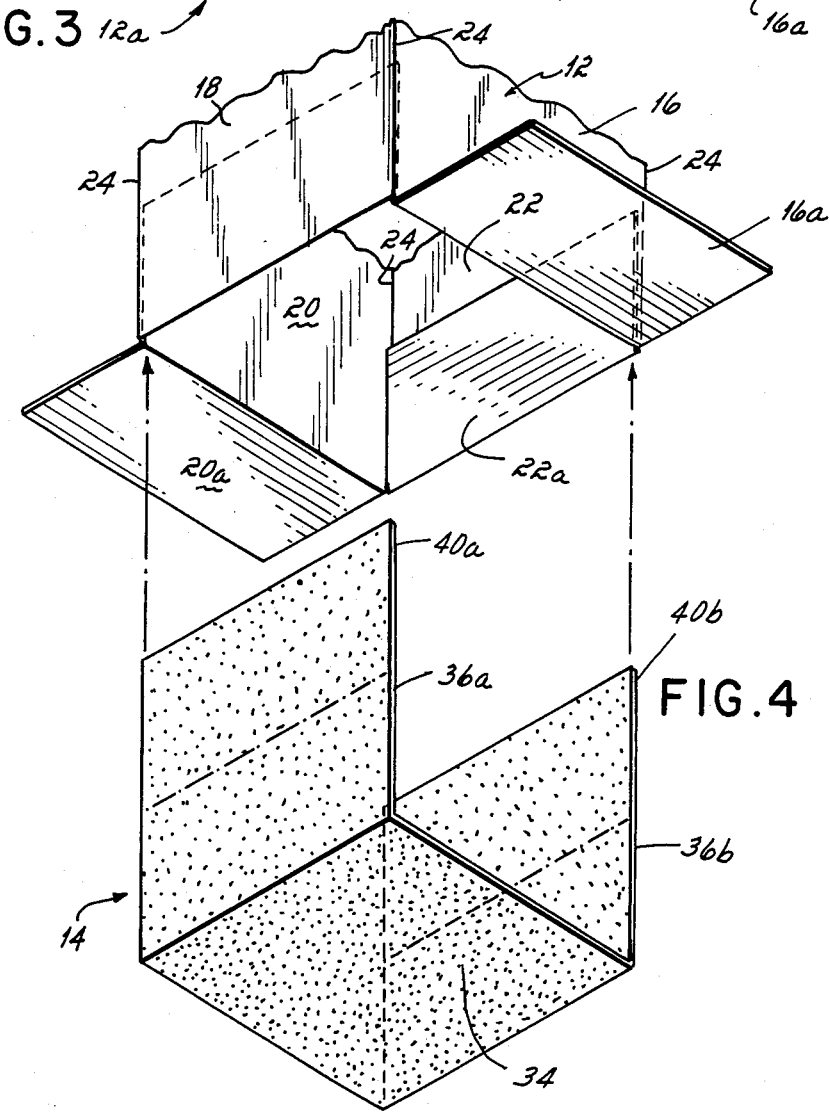
FIG. 4 is a perspective view, partially broken away, illustrating one step in the procedure of assembling the electrostatic discharge pad within the container of FIG. 1.

With reference now to FIGS. 4–7, there is illustrated the procedure by which the container 10, including the carton 12 and the electrostatic discharge pad 14, are assembled. With reference first to FIG. 4, it will be noted that as a first step in the assembly of the pad 14 and carton 12, the carton is first erected into a rectangular, tubular configuration and the flap 26 attached to the inside wall 18 of the container. In preparation for the receipt of the electrostatic discharge pad 14 into the open bottom of the container, the inside flaps 18a, 22a are first folded completely inwardly until the flaps rest in juxtaposition to the side walls 18 and 22, respectively. The outside flaps 16a, 20a are at this time folded outwardly relative to the side walls 16 and 20 from which they extend. With the carton so prepared, the electrostatic discharge pad 14 is folded into a generally U-shaped configuration wherein the central portion 34 of the pad is located in a horizontal plane beneath the open bottom of the carton 12, and the end portions 36a, 36b of the carton extend upwardly from the central portion 34.

As illustrated in FIG. 5, the next step in the assembly procedure is to insert the upper end sections 40a, 40b of the end portions 36a, 36b of the pad upwardly into the carton until the endmost sections 40a, 40b overlie and reside in juxtaposition to the inwardly folded flaps 18a, 22a. With the pad in this position relative to the open end of the carton 12, the outer flaps 16a, 20a are then folded inwardly until they substantially close the otherwise open bottom end of the carton 12.

The pad 14 is then pushed upwardly until the center portion 34 of the pad completely overlies and rests in juxtaposition to the bottom outside flaps 16a, 20a of the carton. The carton is then in the position illustrated in FIG. 6 with the end portions 36a, 36b extending directly upwardly from the bottom center portion 34 of the pad.

With reference to FIG. 7, it will be seen that the next step in the assembly process is to fold one of the inside flaps 18a and the end portion 36a of the pad downwardly until the end portion of the pad overlies and rests in juxtaposition to and against the inside surface of the flaps 16a, 20a. The endmost section 40a of the end portion 36 of the pad is then folded over the inside surface of the flap 18a, to the position illustrated in FIGS. 1 and 7, such that that endmost section 40a covers the inside surface of the flap 18a. This same procedure is then followed with respect to the other end portion 36b of the pad and the flap 22a. That is, the flap 22a and the end portion 36b resting against that flap 22a are folded inwardly from the position illustrated in FIG. 6 until the end portion 36b overlies and rests against the inside surface of the flaps 16a, 20a. The endmost section 40b of the end portion 36b is then folded outwardly so as to place the endmost section 40 of the end portion 36b of the pad atop and in juxtaposition to the flap 22a.

As will now be apparent from the description of the assembly procedure described hereinabove, the electrostatic discharge pad, after having followed this assembly procedure, will reside in the position illustrated in FIG. 1 wherein the center portion 34 of the pad completely covers the exterior surface of the closure wall 30 of the carton 12, and the end portions 36a and 36b of the pad weave or extend between the outside flaps 16a, 20a of that closure wall 30 and the inside flaps 18a, 22a to reside atop those inside flaps on the interior of the carton. The electrostatic pad then electrically connects the interior of the carton, and any electronic goods or electrically conductive carton dividers resting atop that pad, to the exterior of the carton and any grounded object upon which the carton may then be resting.

While the assembly procedure described hereinabove relative to the assembly of the pad and the bottom closure wall of the carton has been illustrated and described as if the pad were inserted upwardly into the bottom of the carton, in actual practice the carton would be inverted and the assembly made through the open top of the carton. After completion of the assembly of the pad with the top closure wall of the carton, the assembled container would then be inverted to create the product illustrated in FIG. 1 of the drawings.

With reference to FIG. 8, there is illustrated a second modification of this invention. According to this modification, the carton 12' and the electrostatic discharge pad 14' are identical to the carton and pad of the first embodiment. The difference between this modification and the modification of FIG. 1 resides in that in this modification, the central portion 34' of the pad 14' is located on the inside of the carton 12', and the endmost sections 40a' and 40b' are located on the outside of the closure wall 30'. More specifically, the end portions 36a' and 36b' of the pad 14' extend between the inside and outside flaps from the center portion 34' and wrap around the outside flaps of the carton such that the endmost sections 40a' and 40b' of the pad reside in juxtaposition to the outside walls of the outside flaps of the carton. As in the first embodiment of FIG. 1, the electrostatic pad 14' of this invention electrically connects the interior of the container 10' to the exterior of the container and to any grounded object upon which that container may be resting.

While I have described only a single preferred embodiment of my invention, persons skilled in this art will appreciate changes and modifications which may be made without departing from the spirit of my invention. For example, the electrostatic discharge pad 14 has been described hereinabove as a volume conductive composite material pad manufactured from paperboard or other material having a high carbon content such that the pad is electrically conductive. Obviously, pads made from other volume conductive materials could be substituted for the pad 14 described hereinabove. Additionally, pads made from electrically non-conductive materials, as for example, cardboard coated on both sides with an electrically conductive coating, such as a carbon containing ink, could be substituted for the pad 14 described hereinabove so long as the opposite sides of the pad are electrically interconnected, as for example, by electrically conductive staples passing through the pad. Alternatively, a pad made from non-conductive material and coated on only one side with an electrically conductive coating could be utilized, but that pad would then be required to have one additional fold and additional section on each end 36 of the pad 14 so as to enable that coated and electrically conductive side to be exposed both to the interior of the container and the exterior of the container on the bottom side of the pad. Other changes and modifications will also be apparent to those skilled in this art. Therefore, I do not intend to be limited except by the scope of the following appended claims.

I claim:

1. A six-walled container for protecting electronic goods contained therein from damage due to electrostatic discharge constructed from a flat blank, said blank having four side walls and a pair of closure walls formed by flaps of said side walls, said side walls and flaps being joined together collectively to present a six-walled container defining a cavity for the electronic goods, and at least one electrostatic discharge pad having one portion residing on one side of one of said closure walls and a second portion of said pad extending between said flaps of said one closure wall to the opposite side of said one closure wall.

2. The six-walled container of claim 1 wherein said one portion of said electrostatic discharge pad is a central portion thereof and said second portion comprises a pair of end sections extending from said central portion.

3. The six-walled container of claim 2 wherein each of said end sections of said electrostatic discharge pad passes from the exterior of said container between and parallel to a pair of said flaps of adjacent ones of said walls of said container and into the interior of said container.

4. The six-walled container of claim 3 wherein each of said end sections of said electrostatic discharge pad has an endmost portion which resides on the inside of said container in juxtaposition to an innermost one of the pair of flaps between which said end section passes.

5. The six-walled container of claim 2 wherein each of said end sections of said electrostatic discharge pad passes from the interior of said container between and parallel to a pair of said flaps of adjacent ones of said walls of said container to the exterior of said container.

6. The six-walled container of claim 5 wherein each of said end sections of said electrostatic discharge pad has an endmost portion which resides on the outside of said container in juxtaposition to an outermost one of the pair of flaps between which said end section passes.

7. A six-walled container for protecting electronic goods contained therein from damage due to electrostatic discharge constructed from a flat blank, said blank having four side walls and a pair of closure walls formed by flaps of said side walls, said side walls and flaps being joined together collectively to present a six-walled container defining a cavity for the electronic goods, and at least one electrostatic discharge pad having one portion residing over one surface of one of said closure walls and a second portion of said pad extending between said flaps of said side walls to the opposite side of said one closure wall.

8. The six-walled container of claim 7 wherein said one portion of said electrostatic discharge pad is a central portion thereof and said second portion comprises a pair of end sections extending from said central portion.

9. The six-walled container of claim 8 wherein said central portion of said electrostatic discharge pad is located on the exterior of said container and each of said end sections of said electrostatic discharge pad passes from the exterior of said container between and parallel to a pair of said flaps of adjacent ones of said walls of said container and into the interior of said container.

10. The six-walled container of claim 9 wherein each of said end sections of said electrostatic discharge pad has an endmost portion which resides on the inside of said container in juxtaposition to an innermost one of the pair of flaps between which said end section passes.

11. The six-walled container of claim 8 wherein said central portion of said electrostatic discharge pad is located on the interior of said container and each of said end sections of said pad passes from the interior of said container between and parallel to a pair of said flaps of adjacent ones of said walls of said container to the exterior of said container.

12. The six-walled container of claim 11 wherein each of said end sections of said electrostatic discharge pad has an endmost portion which resides on the outside of said container in juxtaposition to an outermost one of the pair of flaps between which said end section passes.

13. A six-walled container for protecting electronic goods contained therein from damage due to electrostatic discharge constructed from a flat blank, said blank having four side walls interconnected by parallel score lines and a pair of flaps extending from opposite sides of each of said four side walls, said side walls and flaps being erected and joined together collectively to present a six-walled container having four side walls and a pair of closure walls defining a cavity for the electronic goods, each of said closure walls being formed by four of said flaps, one of which extends from each of said four side walls, and at least one electrostatic discharge pad having one portion residing over one surface of one of said closure walls and a second portion of said pad extending between said flaps of said one closure wall to the opposite surface of said one closure wall.

14. The six-walled container of claim 13 wherein said one portion of said electrostatic discharge pad is a central portion thereof and said second portion comprises a pair of end sections extending from said central portion.

15. The six-walled container of claim 14 wherein said central portion of said pad is located on the exterior of said container and each of said end sections of said pad passes from the exterior of said container between and parallel to a pair of said flaps of adjacent ones of said walls of said container and into the interior of said container.

16. The six-walled container of claim 15 wherein each of said end sections of said electrostatic discharge pad has an endmost portion which resides on the inside of said container in juxtaposition to an innermost one of the pair of flaps between which said end section passes.

17. The six-walled container of claim 14 wherein said central portion of said pad is located on the interior of said container and each of said end sections of said pad passes from the interior of said container between and parallel to a pair of said flaps of adjacent ones of said walls of said container to the enterior of said container.

18. The six-walled container of claim 17 wherein each of said end sections of said pad has an endmost portion which resides on the outside of said container in juxaposition to an outermost one of the pair of flaps between which said end section passes.

19. A method of assembling a six-walled container and an electrostatic discharge pad for protecting electronic goods contained within said container from damage due to electrostatic discharge, said container being constructed from a flat blank, said blank having four side walls interconnected by parallel score lines and a pair of flaps extending from opposite ends of each of said four side walls, said flaps being connected to the side walls from which they extend by score lines, said method comprising
erecting said side walls to form said container into a rectangular configuration having said flaps extending from opposite ends of each of said side walls,
folding one pair of said flaps on one end of said container inwardly into juxaposition with the side walls to which said one pair are connected by score lines,
folding a second pair of said flaps on said one end of said container outwardly from the side walls to which sad second pair are connected by score lines,
positioning said electrostatic discharge pad so that the central portion of said pad is located over said one end of said container with opposite ends of said pad extending into the interior of said container with said opposite ends of said pad residing in juxaposition to said one pair of inwardly folded flaps,
folding said second pair of flaps into the interior of said container while said central portion of said pad resides outside said container and said opposite ends of said pad reside in juxaposition to said one pair of inwardly folded flaps,
moving said pad further into said container until said central portion of said pad resides in juxaposition to and covers said second pair of inwardly folded flaps, and
folding said first pair of flaps and said opposite ends of said pad inwardly into said container and into juxaposition with said inwardly folded second pair of flaps so that said first and second pair of inwardly folded flaps form a closure over one end of said container and said pad covers the exterior of said one end of said container and extends between said flaps into the interior of said container.

20. The method of claim 19 which further comprises folding the endmost portions of said opposite ends of said pad outwardly and into juxaposition with the inside surfaces of said first pair of flaps.

21. The method of protecting electrostatic goods contained within a six-walled container from damage due to electrostatic discharge, which container has four side walls and a pair of closure walls formed by flaps extending from opposite edges of each of said side walls, which method comprises
locatinng the central portion of an electrically conductive electrostatic discharge pad over an exterior surface of one of said closure walls, and
inserting opposite ends of said pad between said flaps of said one closure wall into the interior of said container such that said interior of said container is electrically connected to the exterior of said one closure wall by said pad.

22. The method of protecting electrostatic goods contained within a six-walled container from damage due to electrostatic discharge, which container has four side walls and a pair of closure walls formed by flaps extending from opposite edges of each of said side walls, which method comprises
locating the central portion of an electrically conductive electrostatic discharge pad over an interior surface of one of said closure walls, and
inserting opposite ends of said pad between said flaps of said one closure wall to the exterior of said container such that said interior of said container is electrically connected to the exterior of said one closure wall by said pad.

23. A six-walled container for protecting electronic goods contained therein from damage due to electrostatic discharge constructed from a flat blank, said blank having four side walls and a pair of closure walls formed by flaps of said side walls, said side walls and flaps being joined together collectively to present a six-walled container defining a cavity for the electronic goods, and
at least one electrostatic discharge pad having one portion residing over an exterior surface of one of said walls and a second portion of said pad extending between said flaps of said side walls into the interior of said container.

24. The six-walled container of claim 23 wherein said one portion of said electrostatic discharge pad is a central portion thereof and said second portion comprises a pair of end sections extending from said central portion.

25. The six-walled container of claim 24 wherein each of said end sections of said electrostatic discharge pad passes from the exterior of said container between and parallel to a pair of said flaps of adjacent ones of said walls of said container and into the interior of said container.

26. The six-walled container of claim 25 wherein each of said end sections of said electrostatic discharge pad has an endmost portion which resides on the inside of said container in juxtaposition to an innermost one of the pair of flaps between which said end section passes.

27. A multi-walled container for protecting electronic goods contained therein from damage due to electrostatic discharge constructed from a flat blank, said blank having multiple side walls and at least one closure wall formed by flaps of said side walls, said side walls and flaps being joined together collectively to present a multi-walled container defining a cavity for the electronic goods, and
- at least one electrostatic discharge pad having one portion residing over an exterior surface of one of said closure walls and a second portion of said pad extending between said flaps of said side walls into the interior of said container.

28. The multi-walled container of claim 27 wherein said one portion of said electrostatic discharge pad is a central portion thereof and said second portion comprises a pair of end sections extending from said central portion.

29. The six-walled container of claim 28 wherein each of said end sections of said electrostatic discharge pad passes from the exterior of said container between and parallel to a pair of said flaps of adjacent ones of said walls of said container and into the interior of said container.

30. The multi-walled container of claim 28 wherein each of said end sections of said electrostatic discharge pad has an endmost portion which resides on the inside of said container in juxtaposition to an innermost one of the pair of flaps between which said end section passes.

* * * * *

UNITED STATES PATENT AND TRADEMARK OFFICE
CERTIFICATE OF CORRECTION

PATENT NO. : 4,798,290

DATED : January 17, 1989

INVENTOR(S) : Judson A. Bradford

It is certified that error appears in the above-identified patent and that said Letters Patent is hereby corrected as shown below:

Column 7, line 26, "enterior" should be -- exterior -- .

Column 8, line 17, "locatinng" should be -- locating -- .

Column 10, line 3, "six-walled" should be -- multi-walled -- .

Signed and Sealed this

Twenty-second Day of October, 1991

Attest:

HARRY F. MANBECK, JR.

*Attesting Officer*  *Commissioner of Patents and Trademarks*